United States Patent
Zhang et al.

(10) Patent No.: US 10,505,138 B2
(45) Date of Patent: Dec. 10, 2019

(54) ORGANIC LIGHT-EMITTING DIODE STRUCTURE

(71) Applicant: Shenzhen China Star Optoelectronics Technology Co., Ltd., Shenzhen, Guangdong (CN)

(72) Inventors: Yunan Zhang, Guangdong (CN); Yawei Liu, Guangdong (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 214 days.

(21) Appl. No.: 15/500,300

(22) PCT Filed: Jan. 22, 2017

(86) PCT No.: PCT/CN2017/072029
§ 371 (c)(1),
(2) Date: Jan. 31, 2017

(87) PCT Pub. No.: WO2018/032729
PCT Pub. Date: Feb. 22, 2018

(65) Prior Publication Data
US 2019/0006612 A1    Jan. 3, 2019

(51) Int. Cl.
*H01L 51/52*      (2006.01)
*H01L 27/32*      (2006.01)
(Continued)

(52) U.S. Cl.
CPC .......... *H01L 51/52* (2013.01); *H01L 27/3246* (2013.01); *H01L 51/5262* (2013.01);
(Continued)

(58) Field of Classification Search
CPC ..... H01L 51/52; H01L 51/5262; H01L 51/56; H01L 27/3246
See application file for complete search history.

(56) References Cited

U.S. PATENT DOCUMENTS 8,791,474 B1 * 7/2014 Bibl ..................... G09G 3/2003
                                                    257/100
2007/0254162 A1 11/2007 Kozaki et al.
(Continued)

FOREIGN PATENT DOCUMENTS

CN    1577003     2/2005
CN    102468322   5/2012
(Continued)

OTHER PUBLICATIONS

International Search Report and Written Opinion for International Application No. PCT/CN2017/072029, dated May 31, 2017.
(Continued)

*Primary Examiner* — Dale E Page
*Assistant Examiner* — Quovaunda Jefferson

(57) ABSTRACT

Disclosed is an organic light-emitting diode structure which includes a substrate, an optically-modified layer, a planarization layer, a pixel definition layer, and an organic light-emitting layer. The optically-modified layer can improve non-uniform luminance of OLEDs manufactured based on the ink-jet printing technology.

9 Claims, 4 Drawing Sheets

(51) Int. Cl.
*H01L 51/56* (2006.01)
*H01L 51/00* (2006.01)

(52) U.S. Cl.
CPC .......... *H01L 51/5284* (2013.01); *H01L 51/56* (2013.01); *H01L 27/3211* (2013.01); *H01L 51/0005* (2013.01); *H01L 51/0011* (2013.01); *H01L 51/0048* (2013.01); *H01L 2251/5369* (2013.01)

(56) References Cited

U.S. PATENT DOCUMENTS

| | | | | |
|---|---|---|---|---|
| 2009/0130427 | A1* | 5/2009 | Grigoropoulos | B41M 5/42 428/323 |
| 2013/0048991 | A1* | 2/2013 | Nakadaira | H01L 27/1225 257/59 |

FOREIGN PATENT DOCUMENTS

| | | |
|---|---|---|
| CN | 102569667 | 7/2012 |
| CN | 102683606 | 9/2012 |
| CN | 103201869 | 7/2013 |
| CN | 103608295 | 2/2014 |
| CN | 105161513 | 12/2015 |
| CN | 106206983 | 12/2016 |
| JP | 2009117758 | 5/2009 |
| JP | 2009117758 A * | 5/2009 |

OTHER PUBLICATIONS

Chinese Office Action and Search Report for Chinese Patent Application No. 201610685072.3 dated Jun. 26, 2017.

* cited by examiner

ORGANIC LIGHT-EMITTING DIODE STRUCTURE

CROSS-REFERENCE TO RELATED APPLICATIONS

The present application claims the priority of Chinese patent application CN 201610685072.3, entitled "Organic light-emitting diode structure" and filed on Aug. 18, 2016, the entirety of which is incorporated herein by reference.

FIELD OF THE INVENTION

The present disclosure relates to the display technical field, and in particular, to an organic light-emitting diode structure manufactured based on the ink-jet printing technology.

BACKGROUND OF THE INVENTION

In recent years, wide attention has been drawn to studies of high-precision patterning in the manufacturing of high-performance micro-semiconductors, electron devices, biological functional materials, etc. Methods for realizing patterning include, but are not limited to, photo-etching, electron-beam etching, micro-contact transfer printing, and ink-jet printing. Conventional photo-etching, electron-beam etching, and micro-contact transfer printing requires complex manufacturing procedures and high costs, which limits their use in large-area patterning. Ink-jet printing technology makes it easier to realize direct writing of complex large-area patterns and patterning in functional composite materials, has simple manufacturing procedures, and is cost-effective, which makes ink-jet printing one of the most promising patterning methods. At present, ink-jet printing technology has been widely applied in the manufacturing of various kinds of functional devices. Ink-jet printing of high-precision patterns can realize accurate location of ink droplets, which is crucial to increase of resolution ratio of the micro-patterns formed and improvement on micro-device functions. Yet, due to restriction of the orifice diameter, the diameter of the smallest dot of or the most narrow line width of the patterns printed by the existing ordinary ink-jet printers, is only 20-30 μm. In the meanwhile, due to the "coffee ring effect" during the evaporation of ink droplets, functional solutes have different deposition density in the center of and on the edge of the ink droplets, which decreases uniformity of the patterns formed. These defects restrict, to a great extent, application of ink-jet printing technology in the manufacturing of high-performance micro-devices.

To further increase the utilization ratio of materials and decrease complexity of manufacturing procedures, great importance has been attached to ink-jet printing technology. The technical principle of ink-jet printing technology is as follows: hole-transporting materials, such as PEDOT/PSS (doped with polyaniline (PANI)), and solutions of RGB (three primary colors, red, green, and blue) light-emitting materials are respectively sprayed, through a micron-sized printing spray head, into the sub-pixel pits on the pre-patterned ITO (indium tin oxide) substrate, so as to form RGB light-emitting pixel units. This non-contact printing method, avoids contamination of functional solutions by contact, remarkably saves expensive light-emitting materials, and further greatly shortens the film-forming time through printing by means of a sprayer head with a plurality of jets (128 or 256). In conclusion, the ink-jet printing technology has significant advantages over the prior art in terms of saving raw materials and reducing costs.

With rapid development of the ink-jet printing technology, an increasing number of manufacturers are using it to manufacture organic light-emitting diodes (OLEDs) and organic light-emitting display devices.

An OLED device manufactured based on the ink-jet printing technology in the prior art comprises a substrate and a metal electrode, an ITO anode, a bank layer, an organic light-emitting layer, and a cathode which are successively formed on the substrate.

After the pixel pits are filled with droplets, the process of forming a film by drying can be explained by a technical term "coffee ring effect", the principle of which is as follows. While the droplets are spreading on the substrate, due to reasons like surface defects, solutes will be affected by the "pinning effect" around the contact line and the droplets will remain in the spreading shape. Since the solvent around the contact line evaporates quickly, the solution will move from the droplet center to the droplet edge to compensate the evaporated solvent, due to which the solutes will deposit on the substrate and a non-uniform thin film with a center thinner than the edge will be formed (i.e. the coffee ring). The "coffee ring effect" will lead to non-uniform luminance of OLEDs.

SUMMARY OF THE INVENTION

Regarding the problems existed in the prior art, the present disclosure provides an organic light-emitting diode (OLED) structure which can improve non-uniform luminance of OLEDs manufactured based on the ink-jet printing technology caused by the "coffee ring effect".

To achieve the above object, the present disclosure provides an OLED structure which comprises a substrate, an optically-modified layer, a planarization layer, a pixel definition layer, and an organic light-emitting layer.

Preferably, the organic light-emitting diode is manufactured based on ink-jet printing technology.

Preferably, the optically-modified layer is provided on the substrate.

Preferably, the planarization layer is provided on the optically-modified layer.

Preferably, the pixel definition layer is evenly distributed in a matrix on the planarization layer.

Preferably, the organic light-emitting layer is provided on both sides of the pixel definition layer on the planarization layer.

Preferably, the optically-modified layer comprises spacers and functional regions.

Preferably, the cross-section shape of the pixel definition layer is an isosceles trapezoid.

Preferably, the functional regions each are formed of a commercialized structural unit, inorganic nanoparticles, or organic nanoparticles.

Preferably, the spacers each are a structural unit with a light-shielding function.

Preferably, the commercialized structural unit is a light guide plate or a diffusion film.

Preferably, the inorganic nanoparticles are ZnO particles or $TiO_2$ particles.

Preferably, the organic nanoparticles are carbon nanotubes.

Preferably, the structural unit with a light-shielding function is a black matrix.

Preferably, the spacers have same patterns as the pixel definition layer.

Preferably, the functional regions are provided on the substrate.

Preferably, the spacers are evenly distributed in a matrix on the functional regions.

Specifically, a method for manufacturing the optically-modified layer comprises steps of:

(1) providing a layer of a functional region material on the substrate and providing a layer of a spacer material on the functional region material through physical deposition, chemical deposition, spin coating, or printing;

(2) shielding the spacer material in an active area with mask plates of an exposure device and exposing the spacer material in a non-active area to light (exposure); and (3) removing the spacer material in the non-active area with a developing solution and retaining the spacer material in the active area, so as to obtain an optically-modified layer (development).

Preferably, functional regions and spacers are evenly distributed in a matrix on the substrate.

Specifically, a method for manufacturing the optically-modified layer comprises steps of:

(1) providing a layer of a spacer material on the substrate through physical deposition, chemical deposition, spin coating, or printing;

(2) shielding the spacer material in an active area with mask plates of an exposure device and exposing the spacer material in a non-active area to light (exposure);

(3) removing the spacer material in the non-active area with a developing solution and retaining the spacer material in the active area (development); and (4) evenly coating spaces between the spacers in the active layer with a layer of ZnO ink or carbon-nanotube nanoparticle ink through ink-jet printing, and performing a baking process, so as to obtain an optically-modified layer.

Compared with the prior art, one or more embodiments of the present disclosure may have the following advantages or beneficial effects.

The optically-modified layer of the present disclosure can be used to improve non-uniform luminance of OLEDs manufactured based on the ink-jet printing technology caused by the "coffee ring effect". The optically-modified layer can be divided into spacers and functional regions according to different functions. The functional regions are provided to adjust luminance of pixels of OLEDs and the spacers are provided to prevent light rays which pass through different functional regions from affecting each other, so as to ensure resolution ratio of display devices.

Refraction or scattering of the light emitted by OLEDs through the functional region structure can realize adjustment of luminance of the emitted light from the optical perspective, the expectable effect of which is shown in FIG. 2. Light rays 21, emitted by an OLED and with non-uniform luminance, are refracted or scattered by an optically-modified layer 12, through which light rays 22 with even luminance are obtained. By way of this, adjustment of luminance of the emitted light is realized.

Other features and advantages of the present disclosure will be further explained in the following description, and partially become self-evident therefrom, or be understood through the embodiments of the present disclosure. The objectives and advantages of the present disclosure will be achieved through the structure specifically pointed out in the description, claims, and the accompanying drawings.

The above technical features can be combined in any suitable manner, or substituted by the equivalent technical features, as long as the purpose of the present disclosure can be achieved.

BRIEF DESCRIPTION OF THE DRAWINGS

The present disclosure will be illustrated in detail hereinafter with reference to the embodiments and the accompanying drawings. In the drawings.

Figure 1:
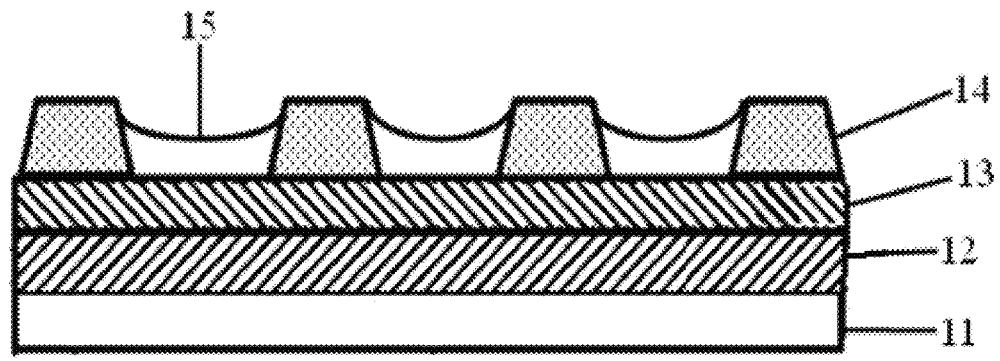
FIG. 1 schematically shows an OLED structure in one embodiment.
Figure 2:
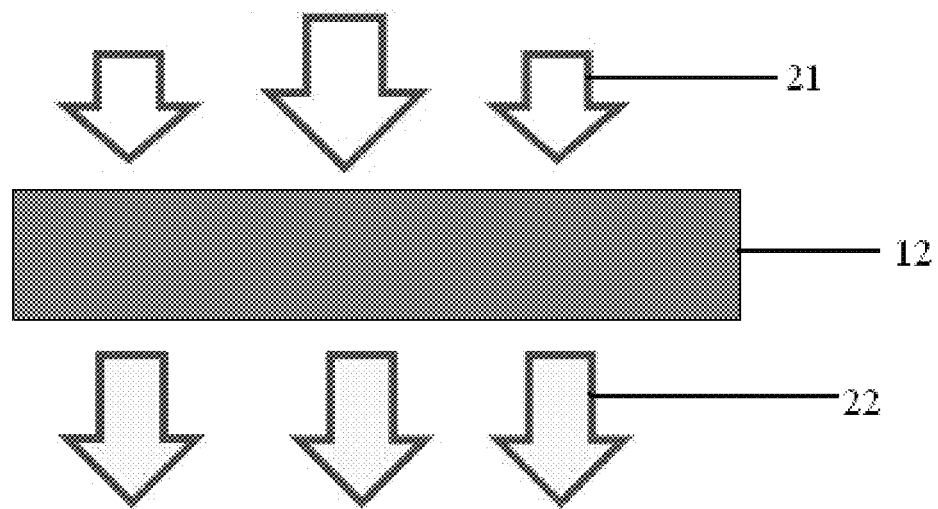
FIG. 2 schematically shows a principle of an expectable result of the present disclosure.

In the drawings, the same components are represented by the same reference signs, and the figures are not drawn to scale.

DETAILED DESCRIPTION OF THE EMBODIMENTS

The present disclosure will be illustrated further with reference to the drawings.

The present disclosure will be explained in details with reference to the embodiments and the accompanying drawings, whereby it can be fully understood how to solve the technical problem by the technical means according to the present disclosure and achieve the technical effects thereof, and thus the technical solution according to the present disclosure can be implemented. It should be noted that, as long as there is no conflict, all the technical features mentioned in all the embodiments may be combined together in any manner, and the technical solutions obtained in this manner all fall within the scope of the present disclosure.

The present disclosure provides an organic light-emitting diode (OLED) structure which can improve non-uniform luminance of OLEDs manufactured based on the ink-jet printing technology caused by the "coffee ring effect".

To achieve the above object, an OLED structure as shown in FIG. 1 is provided. The OLED structure comprises a substrate 11, an optically-modified layer 12, a planarization layer 13, a pixel definition layer 14, and an organic light-emitting layer 15.

Preferably, the organic light-emitting diode is manufactured based on ink-jet printing technology.

Preferably, the optically-modified layer 12 is provided on the substrate 11.

Preferably, the planarization layer 13 is provided on the optically-modified layer 12.

Preferably, a major component of the planarization layer 13 is photosensitive resin.

Preferably, the pixel definition layer 14 is evenly distributed in a matrix on the planarization layer 13.

Preferably, the organic light-emitting layer 15 is provided on both sides of the pixel definition layer 14 on the planarization layer 13.

Preferably, the optically-modified layer 12 comprises spacers and functional regions.

Preferably, the cross-section shape of the pixel definition layer 14 is an isosceles trapezoid.

Preferably, the functional regions each are formed of a commercialized structural unit, inorganic nanoparticles, or organic nanoparticles.

Preferably, the spacers each are a structural unit with a light-shielding function.

Preferably, the commercialized structural unit is a light guide plate or a diffusion film.

Preferably, the inorganic nanoparticles are ZnO particles or $TiO_2$ particles.

Preferably, the organic nanoparticles are carbon nanotubes.

Preferably, the structural unit with a light-shielding function is a black matrix.

Preferably, the spacers have same patterns as the pixel definition layer.

Preferably, an upper part of the pixel definition layer 14 is made of a lyophobic material, repelling the solution of the material of the organic light-emitting layer 15; the lower part thereof is made of a lyophilic material, attracting the solution of the material of the organic light-emitting layer 15. With the upper part and the lower part of the pixel definition layer 14 having different wetability, while the material of the organic light-emitting layer 15 falls onto the lyophobic upper part, the repelling interaction between the two makes the material of the organic light-emitting layer 15 easily fall towards a direction of the substrate and automatically falls back to a pixel region of a corresponding color, rather than flow into an adjacent pixel region of other colors, which avoids color mixture of the material of the organic light-emitting layer 15 of adjacent pixel regions with different colors.

"Lyophilic" and "lyophobic" are defined based on the material of the organic light-emitting layer 15. Thus, no matter what the material of the organic light-emitting layer 15 is, a lyophobic material or a lyophilic material, the upper part of the pixel definition layer 14 is formed by a material the surface energy of which is less than that of the material of the organic light-emitting layer 15 and the lower part thereof is formed by a material the surface energy of which is more than that of the material of the organic light-emitting layer 15. For example, when the solvent of the ink which forms the organic light-emitting layer 15 is 2-ethoxyethanol, the material forming the upper part of the pixel definition layer 14 can be polysiloxane, fluorinated hydrocarbon, etc., and the material forming the lower part thereof can be a polymide polymer, epoxy resin, etc.

Alternatively, the pixel definition layer 14 can be formed by a difunctional pixel separation material the upper part and the lower part of which have different attributes, for example, Asahi difunctional pixel separation material. A pixel definition layer 14 formed by a difunctional pixel separation material the upper part and the lower part of which have different attributes, has a lyophobic upper part and a lyophilic lower part.

Figure 4:
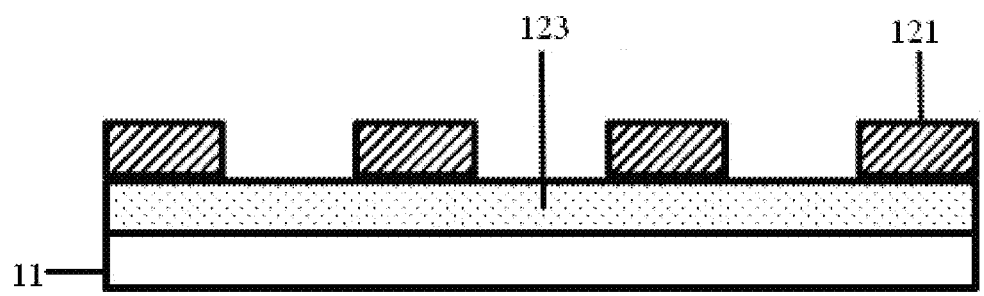
FIG. 4 schematically shows an optically-modified layer in another preferred embodiment of the present disclosure.
Figure 5:
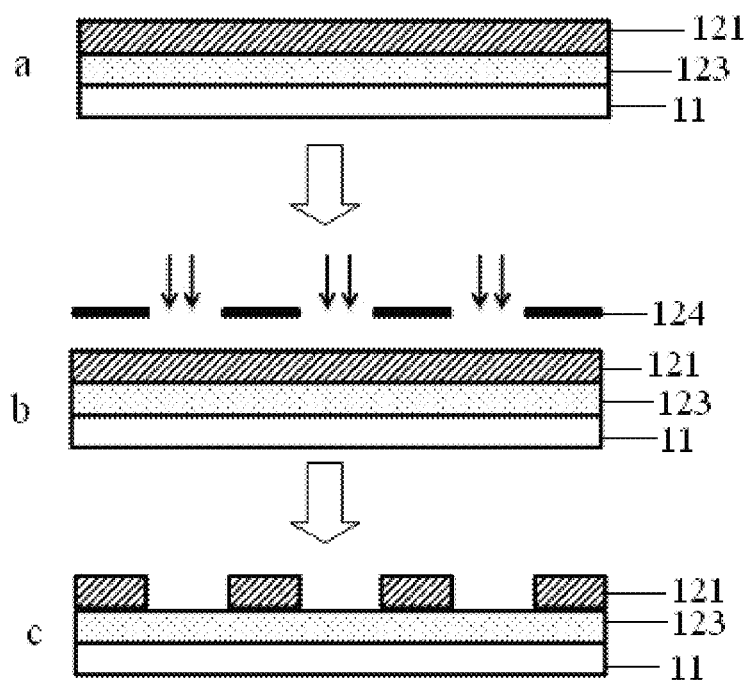
FIG. 5 schematically shows a manufacturing process of the optically-modified layer in FIG. 4.

One preferred embodiment is provided in the present disclosure. As shown in FIG. 4 and FIG. 5, the substrate 11 is a color filter and the OLED manufactured based on the ink-jet printing technology is a white OLED.

Preferably, a functional region 123 is provided on the substrate 11.

Preferably, spacers 121 are evenly distributed in a matrix on the functional region 123.

Specifically, the functional region 123 is a light guide plate.

Specifically, the spacers 121 are black matrices.

Specifically, a method for manufacturing the optically-modified layer comprises steps of:

a. providing a layer of a material of a functional region 123 on the substrate 11 and providing a layer of a material of spacers 121 on the material of the functional region 123 through physical deposition, chemical deposition, spin coating, or printing;

b. shielding the material of the spacers 121 in an active area with mask plates 124 of an exposure device and exposing the material of the spacers 121 in a non-active area to light (exposure); and c. removing the material of the spacers 121 in the non-active area with a developing solution and retaining the material of the spacers 121 in the active area, so as to obtain an optically-modified layer (development).

In this embodiment, the material of the spacers, according to actual demands, can be chosen from high light-shielding materials known in the art. The material of the spacers is preferably a black-matrix photoresist material, or more preferably, a black resin material able to be modified by radiation of light with specified wave length, such as a photo-sensitive resin scattered with light-shielding pigment. The above black resin material has advantages like being cost-effective, being easy to use, being unlikely to cause environmental pollution, etc.

While a black resin material is used as a black-matrix photoresist material, considering that a black resin material may be a positive photoresist material or a negative photoresist material, in the foregoing step b, the black-matrix photoresist material in the active area or in the non-active area is selectively exposed to light and modified. The developing solution used can be easily selected from developing solutions known in the art according to the type of the black-matrix photoresist material.

In this embodiment, the spacers and the pixel definition layer are formed by a photoresist material. The spacers and the pixel definition layer are arranged to have same patterns, which is realized through a same light treatment. The patterning is realized through exposure and development.

Figure 3:
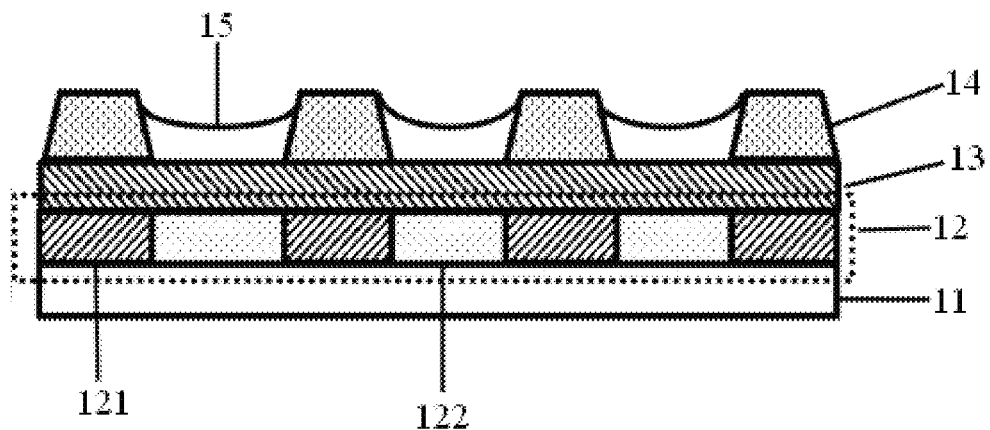
FIG. 3 schematically shows an OLED structure in one preferred embodiment of the present disclosure.
Figure 6:
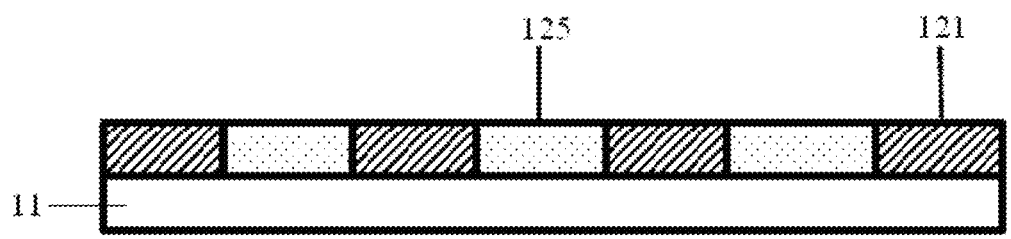
FIG. 6 schematically shows an optically-modified layer in FIG. 3.
Figure 7:
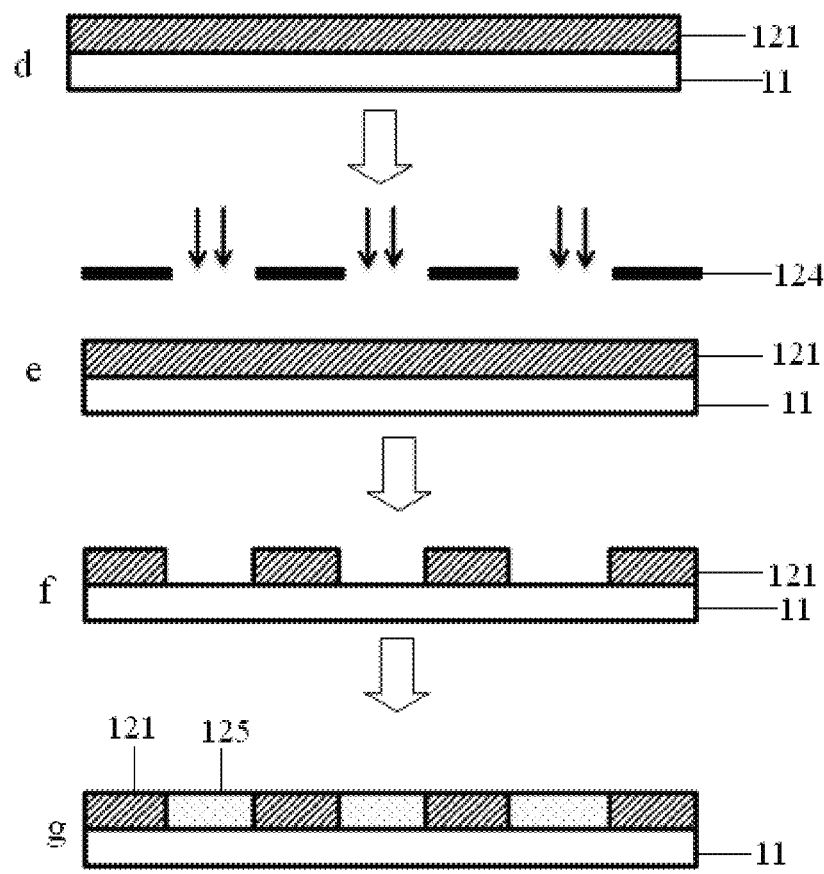
FIG. 7 schematically shows a manufacturing process of the optically-modified layer in FIG. 6.

Another preferred embodiment is provided in the present disclosure. As shown in FIG. 3, FIG. 6, and FIG. 7, the OLED manufactured based on the ink-jet printing technology is an OLED which respectively emits red light, green light, and blue light.

Functional regions 125 and spacers 121 are evenly distributed in a matrix on the substrate 11.

Specifically, a material of the functional regions 125 is ZnO or carbon-nanotube nanoparticles.

Specifically, the spacers 121 are black matrices.

Specifically, a method for manufacturing the optically-modified layer comprises steps of:

d. providing a layer of a material of the spacers 121 on the substrate 11 through physical deposition, chemical deposition, spin coating, or printing;

e. shielding the material of the spacers 121 in an active area with mask plates 124 of an exposure device and exposing the material of the spacers 121 in a non-active area to light (exposure);

f. removing the material of the spacers 121 in the non-active area with a developing solution and retaining the material of the spacers 121 in the active area (development); and g. evenly coating spaces between the spacers 121 in the active layer with a layer of a material of the functional regions 125 (ZnO ink or carbon-nanotube nanoparticle ink) through ink-jet printing, and performing a baking process, so as to obtain an optically-modified layer.

In this embodiment, the material of the spacers, according to actual demands, can be chosen from high light-shielding materials known in the art. The material of the spacers is preferably a black-matrix photoresist material, or more preferably, a black resin material able to be modified by radiation of light with specified wave length, such as a photo-sensitive resin scattered with light-shielding pigment. The above black resin material has advantages like being cost-effective, being easy to use, being unlikely to cause environmental pollution, etc.

While a black resin material is used as a black-matrix photoresist material, considering that a black resin material may be a positive photoresist material or a negative photoresist material, in the foregoing step e, the black-matrix photoresist material in the active area or in the non-active area is selectively exposed to light and modified. The developing solution used can be easily selected from developing solutions known in the art according to the type of the black-matrix photoresist material.

In this embodiment, the spacers and the pixel definition layer are formed by a photoresist material. The spacers and the pixel definition layer are arranged to have same patterns, which is realized through a same light treatment. The patterning is realized through exposure and development.

The baking in step g is performed to cure the black-matrix photoresist material retained in the active area.

Compared with the prior art, one or more embodiments of the present disclosure may have the following advantages or beneficial effects.

The optically-modified layer in this embodiment can be used to improve non-uniform luminance of OLEDs manufactured based on the ink-jet printing technology caused by the "coffee ring effect". The optically-modified layer can be divided into spacers and functional regions according to different functions. The functional regions are provided to adjust luminance of pixels of OLEDs and the spacers are provided to prevent light rays which pass through different functional regions from affecting each other, so as to ensure resolution ratio of display devices.

Although the present disclosure is described hereinabove with reference to specific embodiments, it can be understood that, these embodiments are merely examples of the principles and applications of the present disclosure. Hence, it can be understood that, numerous modifications can be made to the embodiments, and other arrangements can be made, as long as they do not go beyond the spirit and scope of the present disclosure as defined by the appended claims. It can be understood that, different dependent claims and features described herein can be combined in a manner different from those described in the initial claims. It can also be understood that, the technical features described in one embodiment can also be used in other embodiments.

The invention claimed is:

1. An organic light-emitting diode structure, comprising: a substrate, an optically-modified layer, a planarization layer, a pixel definition layer, and an organic light emitting layer, wherein the optically-modified layer is provided on the substrate, the planarization layer is provided on the optically-modified layer, the pixel definition layer is on the planarization layer, and the organic light-emitting layer is provided on both sides of the pixel definition layer on the planarization layer wherein the optically-modified layer is configured to have a light-shielding function, the optically-modified layer comprising spacers and functional regions, and wherein the pixel definition layer comprises an upper part and a lower part, wherein the upper part is made of a lyophobic material and the lower part is made of a lyophilic material.

2. The organic light-emitting diode structure according to claim 1, wherein the spacers have the same patterns as the pixel definition layer.

3. The organic light-emitting diode structure according to claim 1, wherein the functional regions are made of carbon nanotubes.

4. The organic light-emitting diode structure according to claim 1, wherein the spacers are made of a black photoresist or a black resin.

5. The organic light-emitting diode structure according to claim 1, wherein the spacers are evenly distributed in a matrix on the functional regions.

6. The organic light-emitting diode structure according to claim 1, wherein the functional regions and the spacers are evenly distributed in a matrix on the substrate.

7. The organic light-emitting diode structure according to claim 1, wherein material of the functional regions comprises ZnO.

8. A method of forming an organic light-emitting diode structure, comprising:
providing a substrate;
forming an optically-modified layer on the substrate;
forming a planarization layer on the optically-modified layer;
forming a pixel definition layer on the planarization layer; and
forming an organic light-emitting layer on both sides of the pixel definition layer on the planarization layer;
wherein the optically-modified layer comprises spacers and functional regions, wherein material of the functional regions comprises ZnO or carbon nanotubes;
wherein the method further comprises:
shielding the spaces in an active area with mask plates of an exposure device and exposing the spacers in a non-active area to light.

9. The method of forming the organic light-emitting diode structure of claim 8, further comprising:
removing the spacers in the non-active area with developing solution and retaining the spacers in the active area.

* * * * *